United States Patent
Suga

(10) Patent No.: US 6,472,293 B2
(45) Date of Patent: Oct. 29, 2002

(54) METHOD FOR MANUFACTURING AN INTERCONNECT STRUCTURE FOR STACKED SEMICONDUCTOR DEVICE

(75) Inventor: Tadatomo Suga, Tokyo (JP)

(73) Assignees: Oki Electric Industry Co., Ltd., Tokyo (JP); Sanyo Electric Co., Ltd., Osaka (JP); Sony Corporation, Tokyo (JP); Kabushiki Kaisha Toshiba, Kanagawa (JP); NEC Corporation, Tokyo (JP); Sharp Kabushiki Kaisha, Osaka (JP); Hitachi, Ltd., Tokyo (JP); Fujitsu Limited, Kanagawa (JP); Matsushita Electronics Corporation, Osaka (JP); Mitsubishi Denki Kabushiki Kaisha, Tokyo (JP); Rohm Co., Ltd., Kyoto (JP)

( * ) Notice: Subject to any disclaimer, the term of this patent is extended or adjusted under 35 U.S.C. 154(b) by 1 days.

(21) Appl. No.: 09/997,878

(22) Filed: Nov. 30, 2001

(65) Prior Publication Data

US 2002/0074670 A1 Jun. 20, 2002

Related U.S. Application Data

(62) Division of application No. 09/548,916, filed on Apr. 13, 2000.

(30) Foreign Application Priority Data

Apr. 13, 1999 (JP) ............................................ 11-105970

(51) Int. Cl.[7] .............................................. H01L 21/30
(52) U.S. Cl. ........................ 438/455; 438/457; 438/459; 438/106
(58) Field of Search ................................ 438/455–459, 438/106, 107; 257/508, 665–688, 777, 782, 783, 753; 228/123.1

(56) References Cited

U.S. PATENT DOCUMENTS 5,626,279 A * 5/1997 Pamler et al. ............ 228/123.1
2001/0051393 A1 * 12/2001 Ogino et al. ................ 438/106

* cited by examiner

Primary Examiner—Keith Christianson
Assistant Examiner—Yennhu B. Huynh
(74) Attorney, Agent, or Firm—Sonnenschein, Nath & Rosenthal

(57) ABSTRACT

In a multi-layer interconnection structure, the wiring length is to be reduced, and the interconnection is to be straightened, at the same time as measures need to be taken against radiation noise. To this end, there is disclosed a semiconductor device in which plural semiconductor substrates, each carrying semiconductor elements, are bonded together. On each semiconductor substrate is deposited an insulating layer through which is formed a connection wiring passed through the insulating layer so as to be connected to the interconnection layer of the semiconductor element. On a junction surface of at least one of the semiconductor substrates is formed an electrically conductive layer of an electrically conductive material in which an opening is bored in association with the connection wiring. The semiconductor substrates are bonded together by the solid state bonding technique to interconnect the connection wirings formed on each semiconductor substrate.

9 Claims, 10 Drawing Sheets

METHOD FOR MANUFACTURING AN INTERCONNECT STRUCTURE FOR STACKED SEMICONDUCTOR DEVICE

RELATED APPLICATION DATA

This application claims priority to Japanese Application No. P11-105970, filed Apr. 13, 1999, and is a divisional of U.S. application Ser. No. 09/548,916, filed Apr. 13, 2000, and Patent is pending both of which are incorporated herein by reference to the extent permitted by law.

BACKGROUND OF THE INVENTION

1. Field of the Invention

This invention relates to a semiconductor device in which layered films and wiring layers on a semiconductor substrate are bonded together using the solid state bonding technique, and a manufacturing method therefor. More particularly, it relates to an improvement intended for reducing radiation noises.

2. Description of the Related Art

In the field of semiconductor devices, there has so far been known a electromagnetic noise shield for eliminating the noise in which an electrically conductive material is applied to the perimeter of a wiring layer on a semiconductor substrate in an encapsulating fashion, as disclosed for example in Japanese Laying-Open Patent H-5-47767.

There is also known from the Japanese Laying-Open Patent H-5-47943 such a structure in an analog/digital hybrid semiconductor device in which a shield line is arranged between a high-frequency digital signal line and an analog signal line susceptible to noise, at points of intersections, and a shield line is arranged as upper and lower layers and on lateral sides of the analog signal lines.

In the above-described conventional technique, the wiring on the same semiconductor substrate is encapsulated via an insulator with an electrically conductive material to prevent the effect of the radiation noise. This structure is effective to prevent occurrence of radiation noise on the same semiconductor substrate.

However, if the radiation noise on the multi-layer semiconductor substrate is to be prohibited from occurring, the above-mentioned structure cannot directly be used.

Specifically, with the multi-layer semiconductor substrate, a multi-layer film-forming process is required. With the increasing number of layers of the multi-layer film, the surface of the multi-layer film becomes increasingly irregular such that planar smoothness is lost. If the number of layers is increased further, the film surface becomes increasingly irregular to cause line breakage in the course of the process. This indicates that difficulties are met in forming the shield line as described above.

If a higher operating speed is achieved in the semiconductor device in time to come, it becomes necessary to reduce the length of the wiring (to increase the density) and to use wirings closer to straight wirings. That is, since the radiation level is higher in keeping pace with the increase in the operating speed, it is necessary to take measures against radiation noise, to reduce the length of the wiring (to increase the density) and to use wirings closer to straight wirings.

This is intimately related to a device structure of the semiconductor substrate, such that it is necessary to attempt to increase the operating rate of the semiconductor substrate in consideration of the grounding layer, power source layer and the wiring layer surrounding the device structure.

SUMMARY OF THE INVENTION

It is therefore, an object of the present invention to provide a novel semiconductor device in which it is possible to reduce the length of the wiring, to use wirings closer to straight wirings and to take measures against radiation noise, and a method for manufacturing the novel semiconductor device.

In one aspect, the present invention provides a semiconductor device in which a plurality of semiconductor substrates, each carrying semiconductor elements, are bonded together, wherein an insulating layer is deposited on each semiconductor substrate, there being formed a connection wiring passing through the insulating layer for connection to a wiring layer on the semiconductor elements, and wherein an electrically conductive layer of an electrically conductive material, having an opening formed by patterning in register with the connection wiring, is formed on a junction surface of at least one of the semiconductor substrates. The semiconductor substrates are bonded together to interconnect the connection wirings formed on each semiconductor substrate.

In another aspect, the present invention provides a method for manufacturing a semiconductor device in which a plurality of semiconductor substrates, each carrying semiconductor elements, are bonded together, including the steps of depositing an insulating layer on a semiconductor substrate and forming a connection wiring connected to a wiring layer of the semiconductor elements in the insulating layer, forming an electrically conductive layer of an electrically conductive material, having an opening formed by patterning in register with the connection wiring, on a junction surface of at least one of the plural semiconductor substrates, smoothing the junction surface of each semiconductor substrate and applying a compressive load from both sides of the semiconductor substrates placed one on another to interconnect the semiconductor substrates and to interconnect the connection wirings formed in each semiconductor substrate.

According to the present invention, a wiring electrode and a grounding electrode are provided on each semiconductor substrate carrying semiconductor elements. An insulating layer and a grounding layer as an electrically conductive layer are deposited in this order on the surface of each semiconductor substrate. An opening is bored in the insulating layer and in the grounding layer and a grounding layer electrode and the grounding layer are electrically connected to each other via an electrically conductive material charged into the opening. The surfaces of the semiconductor substrates, formed by multiple layers, are planarized and smoothed. The planarized surfaces of the two semiconductor substrates are placed in a facing relation and aligned with respect to each other. The semiconductor substrates, thus aligned, are bonded to each other by applying loads thereon.

By this technique, that is by forming a grounding layer between the two substrates, the radiation noise generated from respective elements on the semiconductor substrate are absorbed by the grounding layer, while the radiation noise generated from each element on the opposite side semiconductor substrate is similarly absorbed by the grounding layer, so that it is possible for the grounding layer to eliminate the reciprocal effect on the semiconductor elements on the semiconductor substrates. Since a common grounding layer is provided between the two substrates, it is possible to effect three-dimensional grounding interconnection via the opening to reduce the grounding wiring length.

Alternatively, a grounding layer and a power source layer, common to two semiconductor substrates, are provided between the two semiconductor substrates. That is, the wiring electrode, grounding electrode and the power source electrode are provided on one of the semiconductor substrates carrying the semiconductor elements, an insulating layer, a grounding layer and an insulating layer are sequentially formed on the surface of the semiconductor substrate, and openings are formed in the insulating layer, grounding layer and in the insulating layer. An electrically conductive member is placed in the openings. The grounding layer is electrically connected to the grounding electrode. The electrically conductive member in one of the openings is connected to the power source electrode, while the electrically conductive member in the remaining opening is connected to the wiring electrode. The grounding wiring layer, power source wiring layer and the through-hole wiring are electrically insulated by an insulator, followed by surface polishing.

On the opposite side semiconductor substrate, carrying semiconductor elements, a wiring electrode, a grounding electrode and a power source electrode are provided, while an insulating layer and a power source layer are sequentially formed on the substrate surface. There are formed openings in the insulating layer and the power source layer and an electrically conductive member is placed in the openings. The grounding layer is electrically connected to the grounding electrode. The electrically conductive member in one of the openings is electrically connected to the power source wiring, while the electrically conductive member in the remaining opening is connected to the wiring electrode. The grounding wiring layer, power source wiring layer and the through-hole wiring are electrically insulated by an insulator, followed by surface polishing. The two substrates are placed in a facing relation to each other and aligned so that the wiring layers grounding layers and the power source wiring are aligned to one another, and a load is applied from both sides of the substrates.

Since the grounding layer and the power source layer operating for grounding and as a power source of the respective elements of the two substrates are provided between the substrates, the wiring length can be effectively reduced, while the radiation noise generated from one of the semiconductor substrates can be absorbed by the grounding layer.

The present invention thus provides an arrangement in which the grounding layer and the power source layer are sandwiched between the two substrates when the substrates are bonded together. Thus, there are provided means for reducing the wiring and prohibiting reciprocal interference of the radiation noises from both substrates.

According to the present invention as described above, since an electrically conductive layer (grounding layer) is provided between the first and second substrates, each carrying semiconductor elements, radiation noises from the semiconductor elements on the first substrate can be shielded without affecting the semiconductor elements on the second substrate. Also, signal transmission between the first and second substrates can be realized by a connection wiring (through-hole wiring) provided in the grounding layer sandwiched between the first and second substrates.

If a conductor layer serving as a power source layer is provided on each of the first and second substrates for extending parallel to a conductor layer operating as a grounding layer, these conductor layers can serve as power sources for the first and second substrates via the through-holes, thus improving the efficiency.

Also, in the manufacturing method according to the present invention, the first and second substrates from the separate processes, carrying the semiconductor elements, are bonded together by the solid state bonding technique. Thus, the multi-layer substrates, comprised of semiconductor substrates having different functions, can be produced easily, thus assuring efficient manufacture.

DESCRIPTION OF THE PREFERRED EMBODIMENTS

Figure 1:
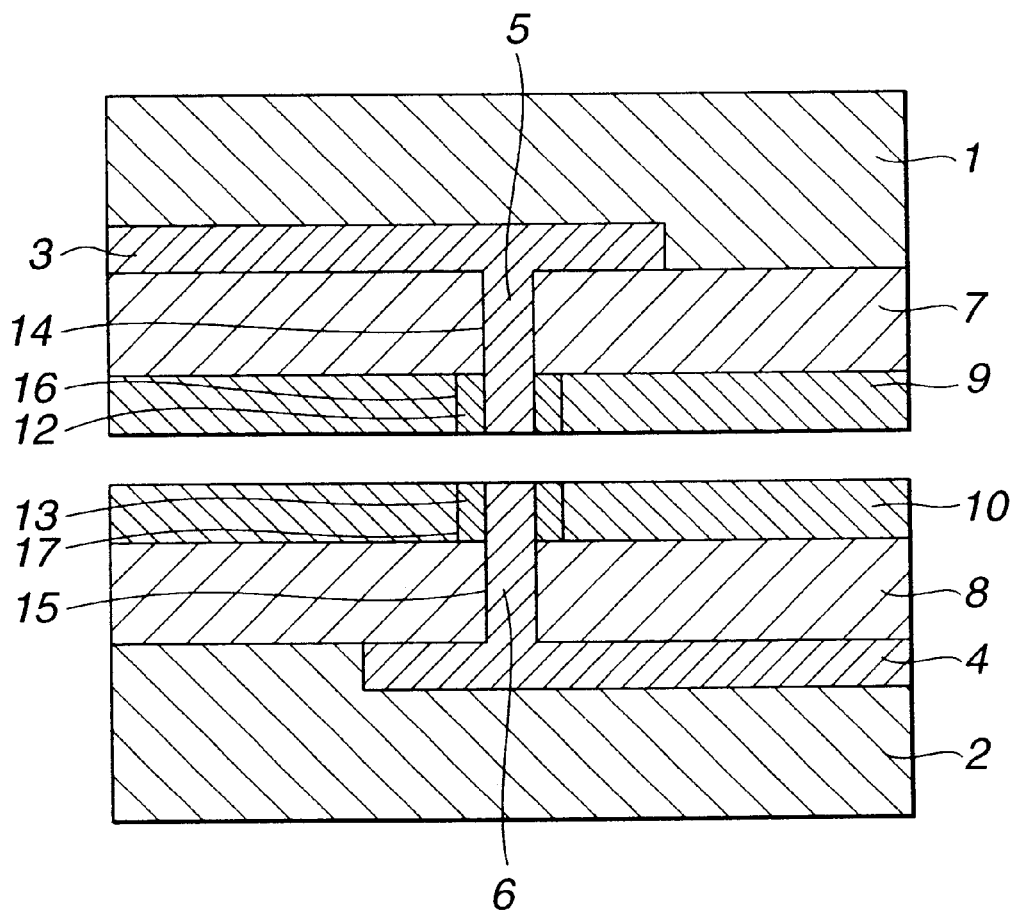
FIG. 1 is a schematic cross-sectional view showing an embodiment of a semiconductor device according to the present invention, and especially showing the state prior to connection for unification.

Referring to the drawings, preferred embodiments of structure of a semiconductor device, and a manufacturing method therefor, according to the present invention, will be explained in detail.

Figure 2:
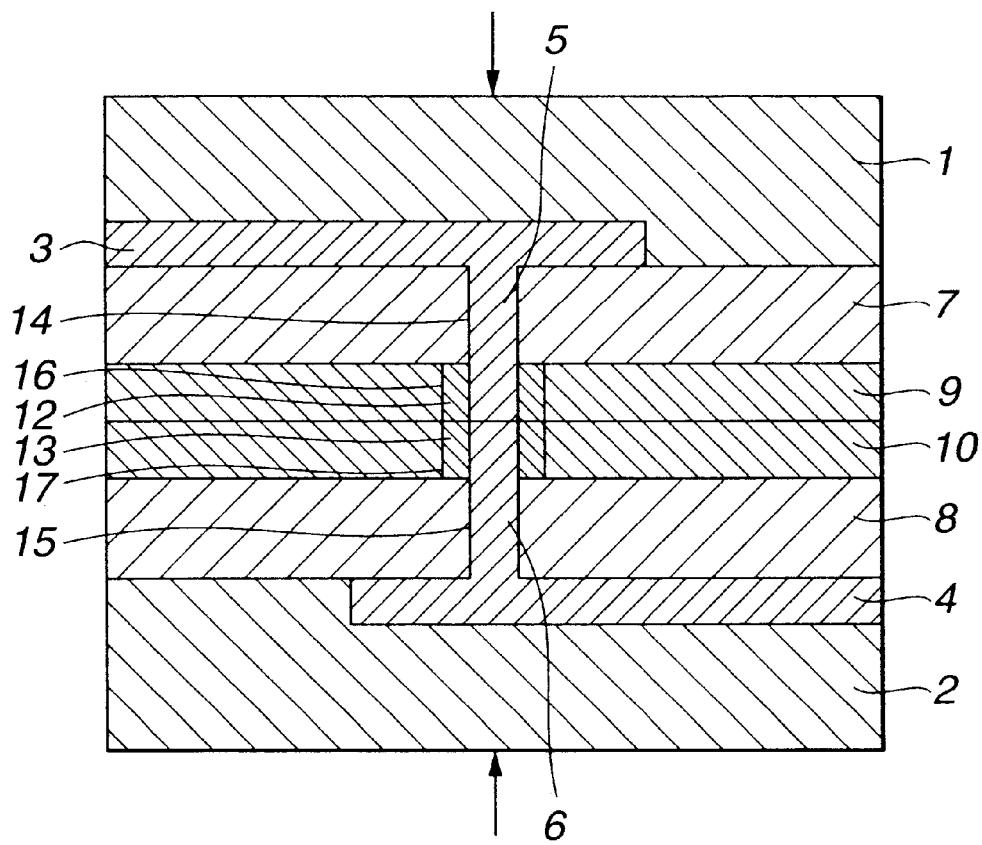
FIG. 2 is a schematic cross-sectional view showing the state of connection and unification of the semiconductor device of FIG. 1.

FIGS. 1 and 2 illustrate features of the semiconductor device embodying the present invention. In the present embodiment, a pair of semiconductor substrates 1, 2, each carrying semiconductor elements, are connected and unified to each other.

On the substrates 1, 2 are formed wiring layers 3, 4, as semiconductor element interconnections, respectively. There are arranged connection wirings 5, 6, termed herein through-hole wirings, within openings, termed herein through-holes. The through-hole wirings 5, 6 may also be so-called plugs, adapted to assure electrically connection via electrically conductive members arranged in holes, instead of the so-called through-hole wirings.

On the substrates 1, 2 are deposited insulating layers 7, 8. The through-hole wirings 5, 6 are formed by charging an electrically conductive material in through-holes 14, 15 formed in these insulating layers 7, 8, respectively.

On the insulating layers 7, 8 are deposited grounding wiring layers 9,10, formed of an electrically conductive metal material, respectively.

The grounding wiring layers 9,10 are each formed substantially as continuous uninterrupted pattern, except that through-holes 16, 17 connecting to the through-holes 14, 15 formed in the insulating layers 7, 8, respectively, are bored therein substantially in register with the through-hole wirings 5, 6, respectively.

Meanwhile, the through-holes 16, 17 are slightly larger in diameter than the through-holes 14, 15 to form gap with respect to the through-holes 7, 8. In this gap are embedded insulating materials 12, 13 to assure insulation between the grounding wiring layers 9,10 and the through-bole wirings 5, 6. Therefore, the through-holes 16, 17 are desirably dimensioned so as not to cause dielectric breakdown of the insulating materials 12, 13 embedded in the gap defined between the grounding wiring layers 9,10 and the through-hole wirings 5, 6.

In the above configuration, the through-hole 14 is first bored in the substrate by a photolithographic process, a film-forming process and a lift-off process. In the through-hole 14 is formed the through-hole wiring 5, using the photolithographic process and the lift-off process, as shown in FIG. 1. The grounding wiring layer 9 having the through-hole 16 then is formed on the insulating layer 7 and the through hole wiring 5 is also formed in the through-hole 16.

The insulating material 12 then is formed between the grounding wiring layer 9 and the through-hole wiring 5, followed by surface polishing.

On the substrate 2, there are similarly formed the insulating layer 8, grounding wiring layer 10, through-hole 15, insulating material 13 and the through-hole wiring 6, followed by surface polishing.

The substrates 1, 2 are placed in register with each other so that the grounding wiring layers 9, 10 face each other. There is then imposed a load from both sides of the substrates 1, 2.

By the imposed load, the substrates 1, 2 are connected to each other, with the through-hole wirings 5, 6 and with the grounding wiring layers 9, 10 being bonded to each other. After the connection, electrical conduction between the through-hole wirings 5, 6 and that between the grounding wiring layers 9, 10 are verified. Meanwhile, the grounding wiring layers 9, 10 are electrically connected to a grounding electrode, not shown, of the substrate 1 and to a grounding electrode, not shown, of the substrate 2, respectively.

In the present embodiment, silicon oxide films were used as the insulating layers 7, 8, whilst copper was used as the grounding wiring layers 9, 10 and through-holes wirings 5, 6. Also, silicon oxide films were used as the insulating materials 12, 13. It is also possible to use an Al oxide film or silicon nitride for the insulating layers 7, 8 and for the insulating materials 12, 13, and to use Au and Al for the grounding wiring layers 9,10 and for the through-hole wirings 5, 6.

Figure 3:
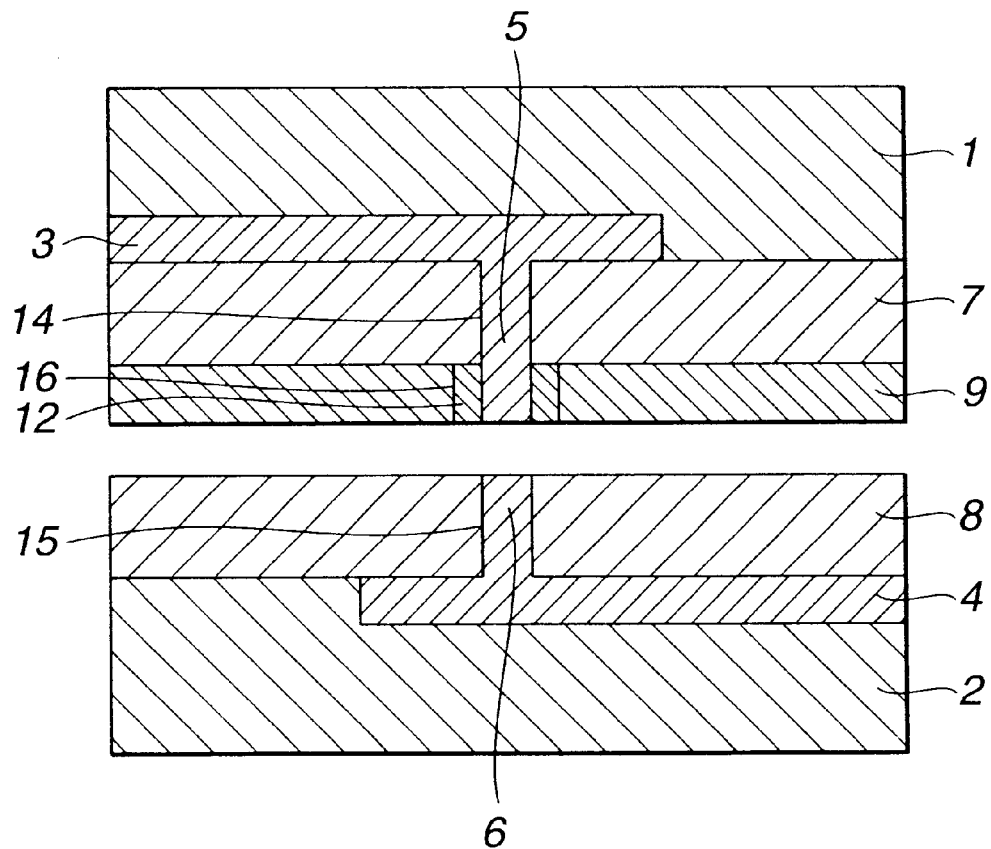
FIG. 3 is a schematic cross-sectional view showing another embodiment of a semiconductor device according to the present invention, and especially showing the state prior to connection for unification.
Figure 4:
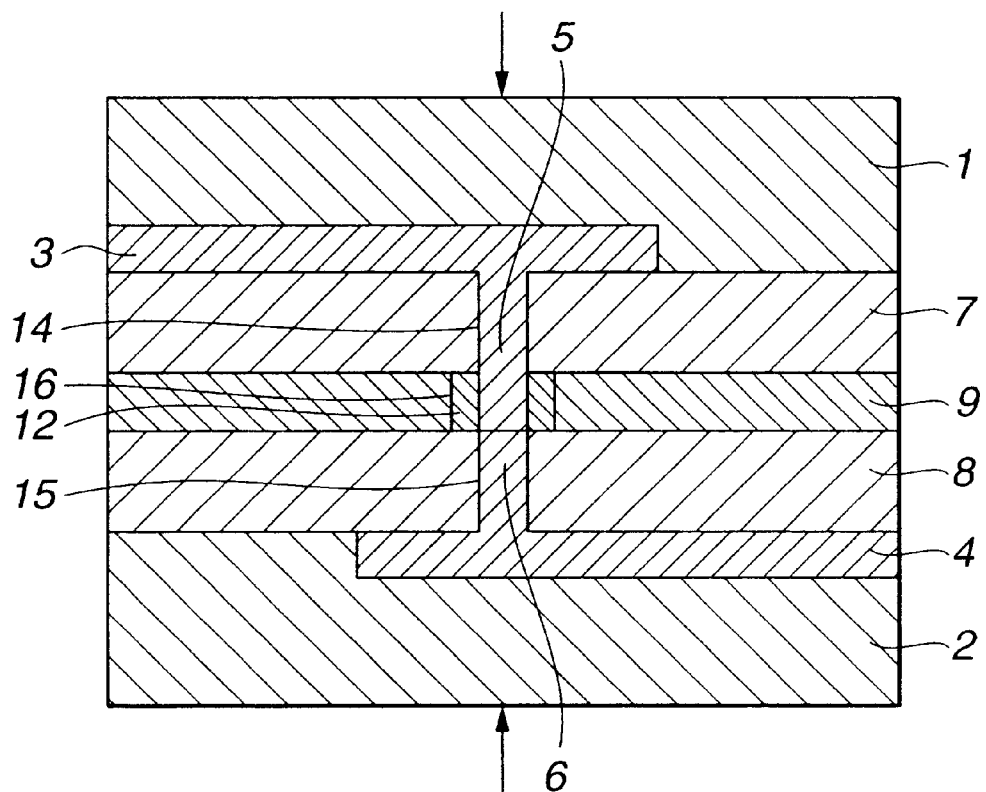
FIG. 4 is a schematic cross-sectional view showing the state of connection for unification of the semiconductor device of FIG. 3.

FIGS. 3 and 4 show a configuration in which the grounding wiring layer is formed on only the substrate 1 of the paired substrates 1, 2 each carrying the semiconductor elements.

On the substrates 1, 2 are formed wiring layers 3, 4, as interconnection for the semiconductor devices. The through-hole wirings 5, 6, formed in the through-holes, are electrically connected to these wiring layers 3, 4, respectively, as in the previous embodiment.

On the substrates 1 and 2 are formed insulating layers 7, 8, respectively. The through-hole wirings 5, 6 are formed by charging the electrically conductive material in through-holes 14, 15 formed in these insulating layers 7, 8, respectively.

On solely the substrate 1, there is formed the grounding wiring layer 9 of e.g., an electrically conductive metal material, by layering on the insulating layer 7.

The grounding wiring layer 9 is formed substantially in a continuous pattern except that an opening (through-hole) 16, connecting to the through-hole 14 formed in the insulating layer 7, is bored therein substantially in register with the through-hole wiring 5.

Meanwhile, the through-hole 16 is formed so as to be slightly larger than the through-hole 14. An insulating material 12 is buried in the gap between the outer periphery of the through-hole 16 and the through-hole wiring 5 to assure insulation between the grounding wiring layer 9 and the through-hole wiring 5.

In the above configuration, the through-hole 14 is first formed in the substrate 1, using a photolithographic process, a film-forming process and a lift-off process. A through-hole wiring 5 then is formed in the through-hole 14, using the photolithographic process and the lift-off process, as shown in FIG. 3. On the insulating layer 7, there is then formed a grounding wiring layer 9, having the through-hole 16, in which the through-hole wiring 5 is also formed.

Between the grounding wiring layer 9 and the through-hole wiring 5, an insulating material is formed, followed by surface polishing.

The insulating layer 8, through-hole 15 and the through-hole wiring 6 are formed similarly, followed by surface polishing.

The substrates 1, 2, thus prepared, are placed in alignment with each other so that the grounding wiring layer 9 and the insulating layer 8 will face each other, and a load is imposed from both sides of the substrates 1, 2.

By the imposed load, the substrates 1, 2 were connected to each other, with the through-hole wirings 5, 6 being bonded to each other and with the grounding wiring layers 9 being similarly bonded to each other. After the connection, electrically conduction between the through-hole wirings 5, 6 is verified. Meanwhile, the grounding wiring layer 9 is electrically connected to a ground electrode, not shown, of the substrate 1.

In the present embodiment, a silicon oxide films, copper, a silicon oxide film and copper, are used for the insulating layers 7, 8, grounding electrode layer 9, through-hole wirings 5, 6 and for the insulating material 12, respectively. It is also possible to use an Al oxide film and a silicon nitride for the insulating layers 7, 8 and for the insulating material 12, and to use Au or Al for the grounding electrode layer 9 and for the through-hole wirings 5, 6.

Figure 5:
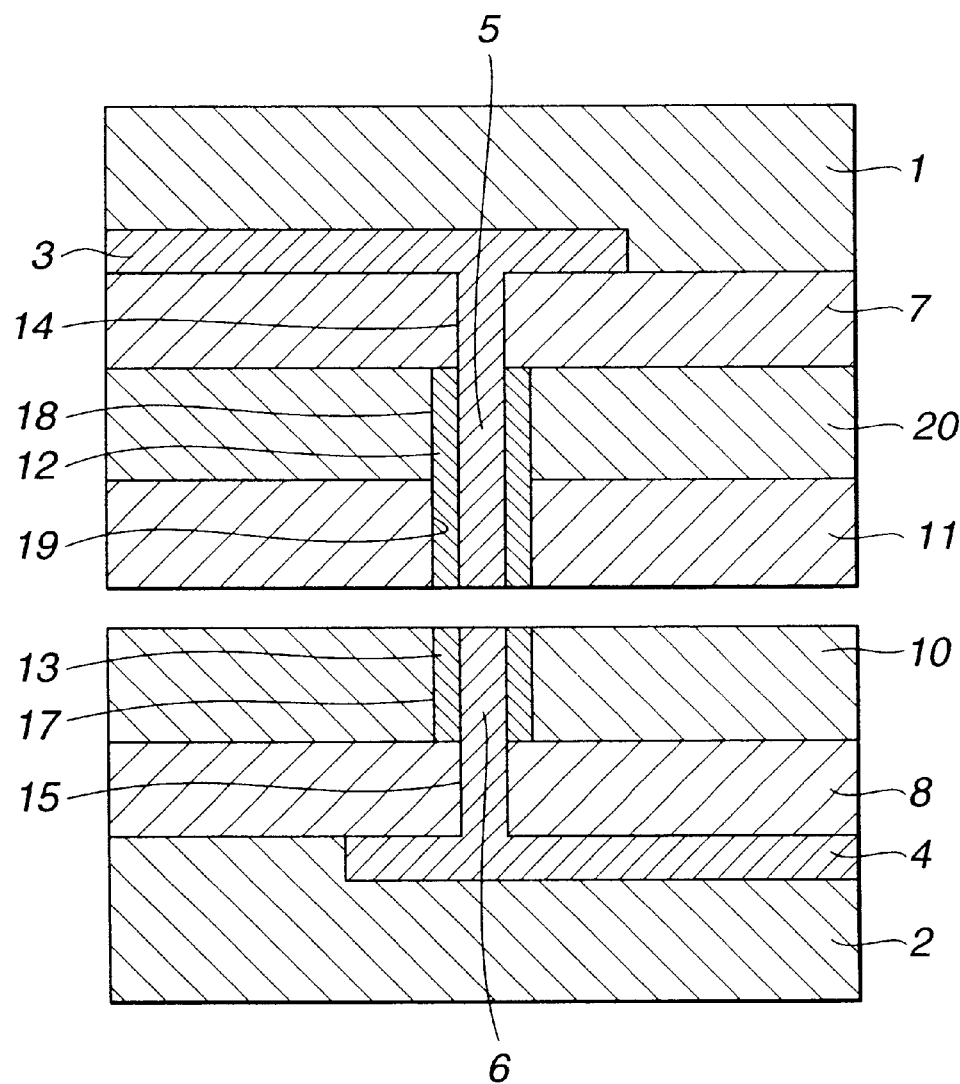
FIG. 5 is a schematic cross-sectional view showing still another embodiment of a semiconductor device according to the present invention, and especially showing the state prior to connection for unification.
Figure 6:
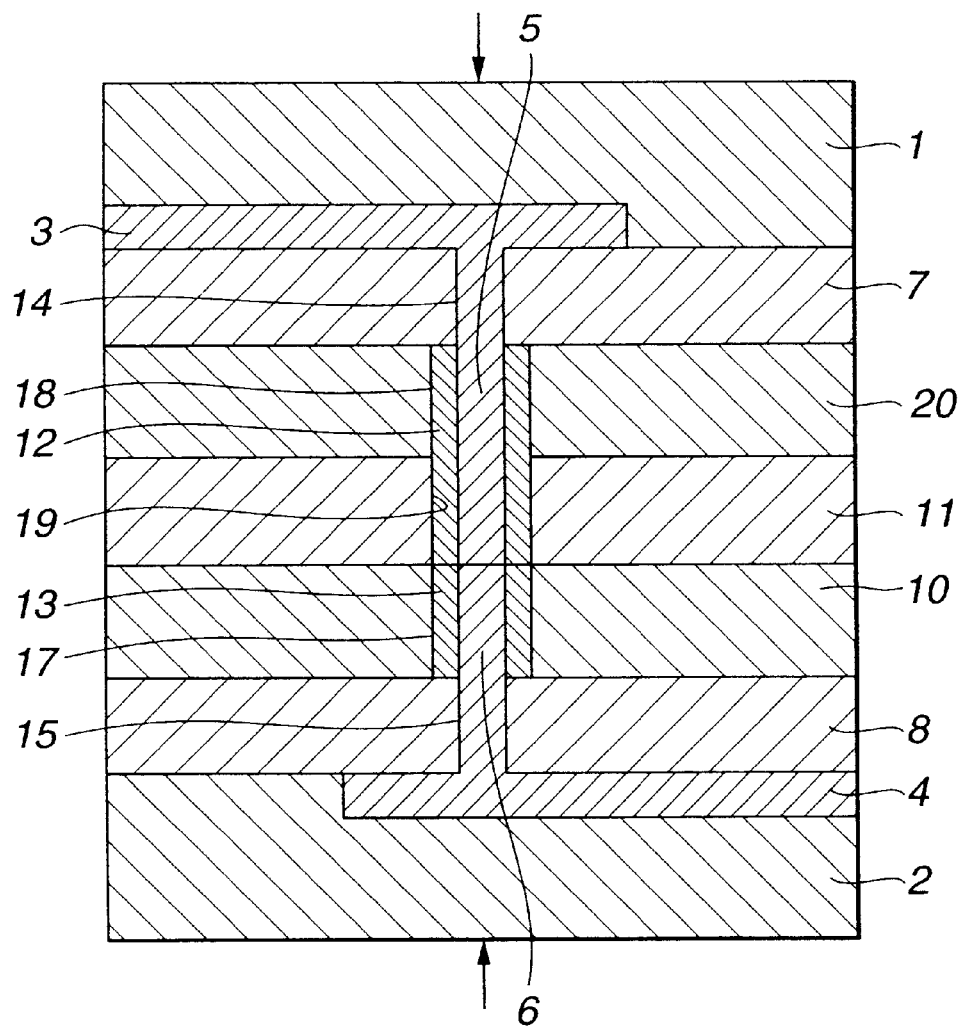
FIG. 6 is a schematic cross-sectional view showing the state of connection for unification of the semiconductor device of FIG. 5.

FIGS. 5 and 6 show a configuration in which a power source wiring layer is formed on the substrate 1 of the paired substrates 1, 2 carrying the semiconductor elements and in which a grounding wiring layer is formed on the opposite side substrate 2.

On the substrates 1, 2 are formed wiring layers 3, 4, as the interconnection for the semiconductor devices, respectively. Through-hole wirings 5, 6, formed in through-holes 14, 15, respectively, are electrically connected to these wiring layers 3, 4, respectively, as in the previous embodiment.

On the substrates 1 and 2 are deposited insulating layers 7, 8. The through-hole wirings 5, 6 are formed by charging an electrically conductive material in the through-holes 14, 15 formed in these insulating layers 7, 8, respectively.

On solely the substrate 2, there is formed the grounding wiring layer 10 of e.g., an electrically conductive metal material, by layering on the insulating layer 8.

The grounding wiring layer 10 is formed substantially in a continuous pattern except that an opening (through-hole) 17 connecting to the through-hole 15 formed in the insulating layer 8 is formed therein substantially in register with the through-hole wiring 6.

Meanwhile, the through-hole 17 is formed so as to be slightly larger than the through-hole 15. An insulating material 13 is buried in the gap between the outer periphery of the through-hole 17 and the through-hole wiring 6 to assure insulation between the grounding wiring layer 10 and the through-hole wiring 6.

As for the opposite side substrate 1, the insulating layer is multi-layered and a power source wiring layer 20 is arranged between the insulating layers 7, 11.

In the power source wiring layer 20 and in the insulating layer 11, there are formed through-holes 18, 19, respectively. A through-hole wiring 5 is passed through these through-holes 18, 19. An insulating material 12 is embedded in a gap to assure electrical insulation between the power source wiring layer 20 and the through-hole wiring 5.

In the above configuration, the through-hole 14 is first formed in the substrate 1, using a photolithographic process, a film-forming process and a lift-off process. The through-hole wiring 5 then is formed in the through-hole 14, using the photolithographic process and the lift-off process, as shown in FIG. 5. On the insulating layer 7, there are then formed the power source wiring layer 20 having the through hole 18 and the insulating layer 11, having the through-hole 19. In these through-holes 18, 19, the through-hole wiring 5 is also formed.

Between the power source wiring layer 20 and the through-hole wiring 5, an insulating material 12 is formed, followed by surface polishing.

Similarly, the insulating layer 8, through-hole 15, through-hole wiring 6 and the grounding wiring layer 10 are formed on the substrate 2, followed by surface polishing.

The substrates 1, 2, thus prepared, are placed in alignment with each other so that the insulating layer 11 and the grounding wiring layer 10 will face each other, and a load is imposed from both sides of the substrates 1, 2.

By the imposed load, the substrates 1, 2 are connected to each other, with the through-hole wirings 5, 6 being bonded to each other and with the insulating layer 11 and the grounding wiring layer 10 being similarly bonded to each other.

In each of the above-described configurations, any suitable method for connection to an external driving circuit, routinely used in a semiconductor device, may be used.

Figure 7:
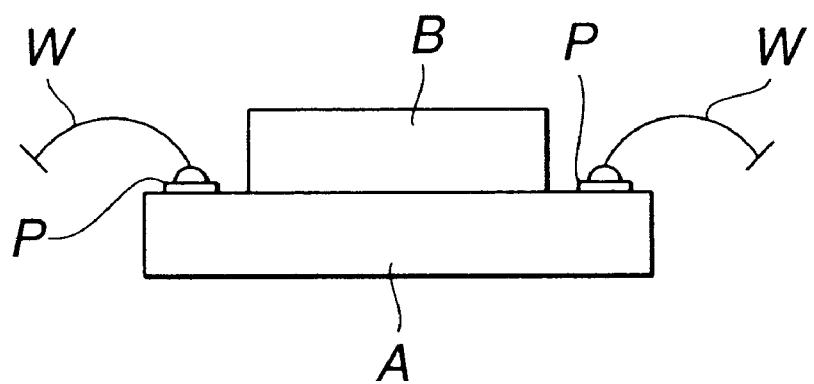
FIG. 7 is a schematic view showing an illustrative connection structure to an external driving circuit.
Figure 8:
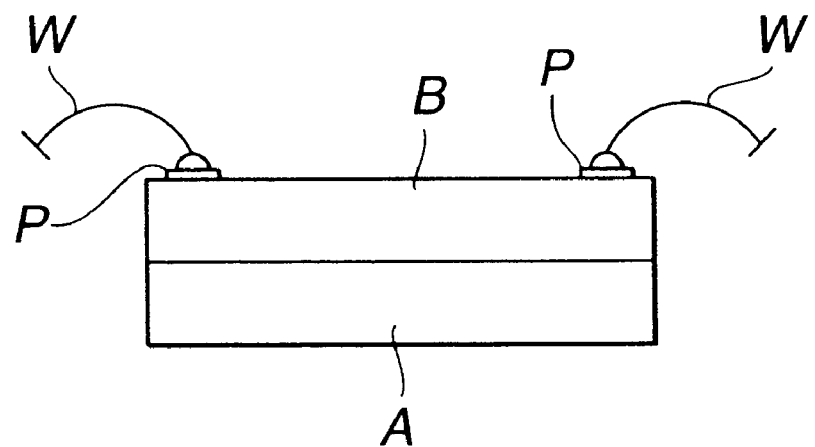
FIG. 8 is a schematic view showing another illustrative connection structure to an external driving circuit.

For example, it suffices if, in FIG. 7, showing a semiconductor device comprised of a semiconductor chip A and a semiconductor chip B bonded together, the outer size of the semiconductor chip A is set so as to be larger than that of the semiconductor chip B, and a connection wire W is wire-bonded to a connection pad P exposed on the junction surface of the semiconductor chip A. It is noted that the structure of the semiconductor device shown in FIG. 7 is shown in any of FIGS. 2, 4 and 6, and that the semiconductor chips A and B are each comprised of a semiconductor substrate, with insulating layers and variable wiring layers formed thereon, as described above.

Alternatively, the semiconductor chips A and B may be of a substantially equal size and a connection wire W may be bonded to a connection pad P formed on the back side of the semiconductor chip B. In this case, the pad P needs to be electrically connected via a through-hole wiring to a pre-set wiring layer of the semiconductor chip B or to a wiring layer exposed to the junction surface of the semiconductor chip A.

The manufacturing method for the semiconductor device of the above-described structure is hereinafter explained.

The manufacturing method exploits solid state bonding. The process used therefor may be enumerated by a process shown in FIG. 9 and a process shown in FIG. 10.

FIG. 9 shows an illustrative manufacturing process by direct solid state bonding of a heterogeneous device substrate. In this manufacturing process, a first semiconductor substrate 21, such as SOI substrate or a hetero-epi substrate, is prepared, as shown in FIG. 9A.

Figure 9A:
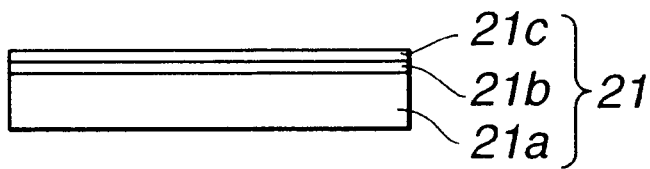
FIGS. 9A to 9G are schematic cross-sectional views showing, step-by-step, an illustrative manufacturing process by the solid state bonding.
Figure 9B:
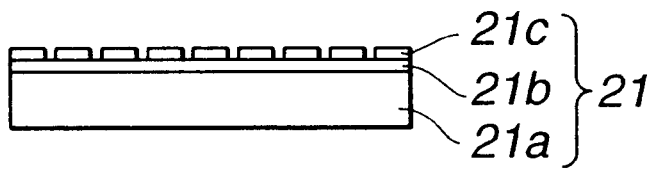

This semiconductor substrate 21 is formed by layering an etching stop layer 21b and a device layer 21c on a silicon base 21a. The device layer 21c is etched to a semiconductor chip, as shown in FIG. 9B.

Figure 9C:
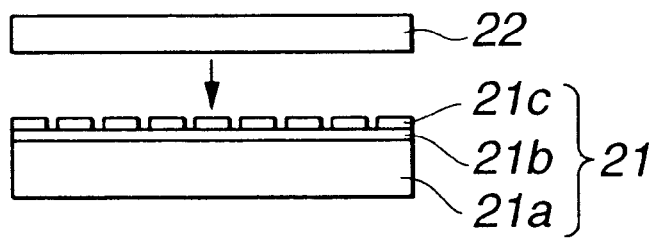

Then, a semiconductor substrate 22, such as a wiring substrate carrying an optional wiring, or a heterogeneous device substrate, is bonded by solid state bonding on the device layer 21c, as shown in FIG. 9C.

The solid state bonding exploits the phenomenon in which, if two wafer surfaces approach to each other, stable arraying is collapsed to produce interatomic attraction and in which, if a certain distance is reached, the attraction is equivalent to that in the bulk to lead ultimately to bonding. The solid state bonding has an advantage that there is no necessity of using an adhesive nor heating.

The surface of an actual solid material is stabilized by oxidation in case of a metal or by adsorption of an organic material. Thus, mere contact is insufficient to produce the connection. However, if the stable surface layer is removed by collision with inert atoms, such as argon atoms, to expose an unstable and active surface, it is possible to realize solid state bonding faithfully conforming to the principle of bonding.

Therefore, in the above-described solid state bonding, smoothing the junction surface and surface activation are indispensable.

Figure 9D:
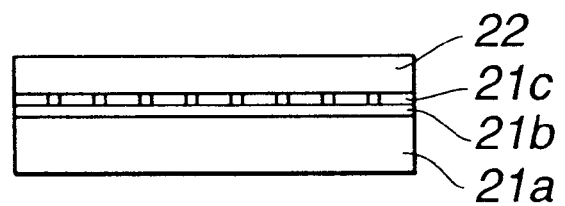
Figure 9E:
Figure 9F:
Figure 9G:

FIG. 9D shows the state in which the second semiconductor substrate 22 is bonded to the first semiconductor substrate 21. The silicon base 21a of the first semiconductor substrate 21 is etched off, as shown in FIG. 9E. An etching stop layer 21b then etched off, as shown in FIG. 9F to complete a three-dimensional integrated circuit.

Finally, the three-dimensional integrated circuit is sliced to give semiconductor chips to give a semiconductor device of a pre-set size.

Figure 10A:
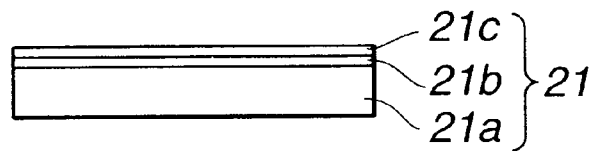
FIGS 10A to 10I are schematic cross-sectional views showing, step-by-step, another illustrative manufacturing process by the solid state bonding.
Figure 10B:
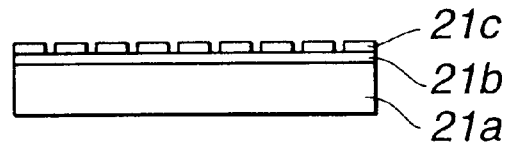
Figure 10C:
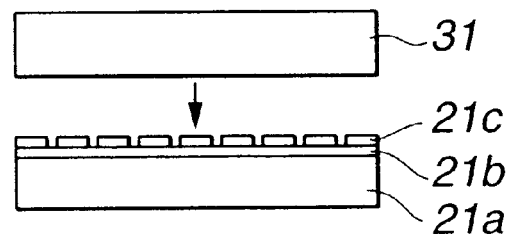
Figure 10D:
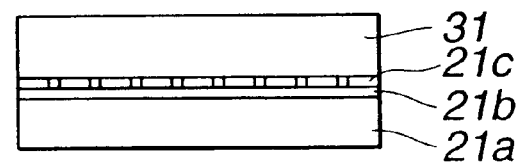
Figure 10E:
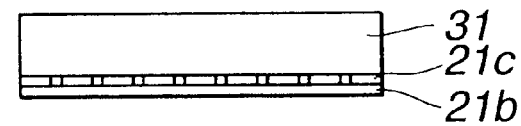
Figure 10F:
Figure 10G:
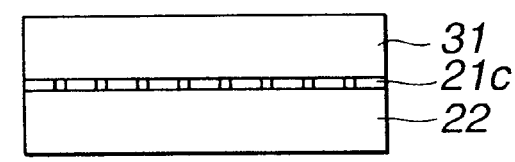
Figure 10H:
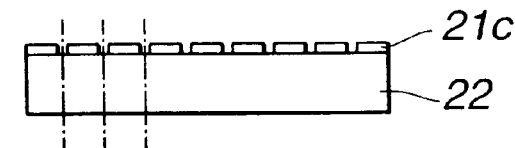
Figure 10:
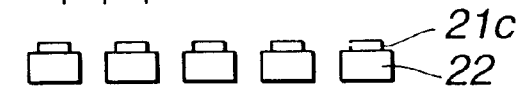

FIG. 10 shows a method employing a dummy substrate. This method is the same as the process of FIG.9 up to etching of the device layer 21c (FIG. 10B).

In this method, the device layer 21c is formed by etching and a dummy substrate 31 is placed thereon and bonded in position (FIGS. 10C to 10D). The silicon base 21a on the first semiconductor substrate 21 is etched off (FIG. 10E). The etching stop layer 21b then is etched off, as shown in FIG. 10F.

In this manner, only the device layer 21c is left over on the dummy substrate. The resulting assembly then is bonded with solid state bonding on the second semiconductor substrate 22, such as a wiring substrate or a heterogeneous device substrate. By this step, the device layer 21c is transcribed onto the second semiconductor substrate 22.

Finally, the dummy substrate 31 is peeled off, as shown in FIG. 10H, and is sliced at a chain-dotted line position, to complete a three-dimensional integrated circuit as shown in FIG. 10I.

The foregoing is a rough manufacturing process. An illustrative process for manufacturing a semiconductor device having the grounding wiring layers and so forth is hereinafter explained.

SPECIFIED EXAMPLE 1 OF THE MANUFACTURING PROCESS

In the present embodiment, two semiconductor substrates, each carrying semiconductor elements, are connected to each other by the following process steps:
(1) a step of previously taking out a wiring electrode on a first semiconductor substrate;
(2) a step of sequentially depositing an insulating layer and a grounding layer on the first substrate and boring through-holes connecting to the wiring electrode in the insulating layer and the grounding layer;
(3) a step of forming a through-hole wiring in the through-holes for electrical connection to the wiring electrode;
(4) a step of forming an insulating layer in the through-hole wiring in the grounding layer between the through-hole wiring and the grounding layer;
(5) a step of smoothing one of the major surfaces of the substrate;
(6) a step of previously taking out a wiring electrode on a second semiconductor substrate;
(7) a step of sequentially depositing an insulating layer and a grounding layer on the second semiconductor substrate and forming through-holes connecting to the wiring electrode in the insulating layer and the grounding layer;
(8) a step of forming a through-hole wiring in the through-hole for electrical connection of the wiring electrode;
(9) a step of forming an insulator between the through-hole wiring and the grounding layer within the through-hole in the grounding layer;
(10) a step of smoothing the surface of the second semiconductor substrate;
(11) a step of placing the first and second semiconductor substrates so that the through-hole wirings and the grounding layers of the first and second semiconductor substrates face each other;
(12) applying compressive load from both sides of the substrates; and
(13) electrically and mechanically connecting the through-hole wirings and the grounding layers under the compressive load.

SPECIFIED EXAMPLE 2 OF THE MANUFACTURING PROCESS

In the present embodiment, two semiconductor substrates, each carrying semiconductor elements, are connected to each other by the following process steps:
(1) a step of previously taking out a wiring electrode on a first semiconductor substrate;
(2) a step of sequentially depositing an insulating layer and a grounding layer on the first substrate and boring through-holes connecting to the wiring electrode in the insulating layer and the grounding layer;
(3) a step of forming a through-hole wiring in the through-holes for electrical connection to the wiring electrode;
(4) a step of forming an insulating layer in the through-hole wiring in the grounding layer between the through-hole wiring and the grounding layer;
(5) a step of smoothing the major surface of the first substrate;
(6) a step of previously taking out a wiring electrode on a second semiconductor substrate;
(7) a step of depositing an insulating layer on the second semiconductor substrate and forming a through-hole connecting to the wiring electrode in the insulating layer;
(8) a step of forming a through-hole wiring in the through-hole for electrical connection to the wiring electrode;
(9) a step of smoothing the major surfaces of the second substrate;
(10) a step of placing the first and second substrates so that the through-hole wirings in the first and second semiconductor substrates will face each other and so that the grounding layer of the first substrate will face the insulating layer of the second substrate;
(11) applying a compressive load from both sides of the two substrates; and
(12) electrically connecting the through-hole wirings together and mechanically connecting the insulating layer of the first substrate and the insulating layer of the second substrate to each other, under the compressive load.

SPECIFIED EXAMPLE 3 OF THE MANUFACTURING PROCESS

In the present embodiment, two semiconductor substrates, each carrying semiconductor element, are connected to each other by the following process steps:
(1) a step of previously taking out a wiring electrode on a first semiconductor substrate;
(2) a step of sequentially depositing an insulating layer, a grounding layer and another insulating layer on the first substrate and boring through-holes connecting to the wiring electrode in the insulating layer, grounding layer and the other insulating layer;
(3) a step of forming a through-hole wiring in the through-holes for electrical connection to the wiring electrode;
(4) a step of forming an insulating layer between the through-hole wiring in the through-holes in the grounding layer and the grounding layer;
(5) a step of smoothing the major surface of the first substrate;
(6) a step of previously taking out a wiring electrode on a second semiconductor substrate;
(7) a step of sequentially depositing an insulating layer and a power source layer on the second semiconductor substrate and forming through-holes connecting to the wiring electrode in the insulating layer and the power source layer;
(8) a step of forming a through-hole for electrical connection to the wiring electrode in the through-hole;
(9) a step of forming an insulator between the through-hole of the wiring electrode and the power source layer;
(10) smoothing the surface of the second semiconductor substrate;
(11) a step of placing the first and second semiconductor substrates in alignment with each other so that the through-hole wirings in the first and second semiconductor substrates will face each other and so that the grounding layers and the insulating layers of the first and second semiconductor substrates face each other;
(12) applying compressive load from both sides of the substrates; and
(13) electrically connecting the through-hole wirings and mechanically connecting the insulating layers and the power source layers under the compressive load.

SPECIFIED EXAMPLE 4 OF THE MANUFACTURING PROCESS

In the present embodiment, two semiconductor substrates, each carrying semiconductor elements, are connected to each other by the following process steps:
(1) a step of taking out a wiring electrode and a grounding electrode on a first substrate;
(2) sequentially depositing an insulating layer and a grounding layer on a first substrate and forming a through-hole connecting to the grounding electrode in the insulating layer;
(3) forming a through-hole wiring electrically connecting to the grounding electrode in the through-hole;
(4) smoothing the surface of the first substrate;
(5) previously taking out a grounding electrode on a second semiconductor substrate;
(6) sequentially depositing an insulating layer and a grounding layer on the second substrate and forming a through-hole connecting to the grounding electrode in the insulating layer;
(7) forming a through-hole wiring electrically connecting to the grounding electrode in the through-hole;
(8) smoothing the surface of the other semiconductor substrate;
(9) placing the first and second semiconductor substrates in alignment with each other so that the grounding layers of the first and second semiconductor substrates will face each other:
(10) applying a compressive load from both sides of the substrates; and
(11) electrically and mechanically connecting the grounding layers under the compressive load.

SPECIFIED EXAMPLE 5 OF THE MANUFACTURING PROCESS

In the present embodiment, two semiconductor substrates, each carrying semiconductor elements, are connected to each other by the following process steps:
(1) a step of previously taking out a wiring electrode on a first semiconductor substrate;
(2) a step of sequentially depositing an insulating layer and a grounding layer on the first substrate and boring a through-hole connecting to the grounding electrode in the insulating layer;
(3) a step of forming a through-hole grounding wiring in the through-hole for electrical connection to the wiring electrode;
(4) a step of smoothing the surface of the first substrate;
(5) a step of previously taking out a grounding electrode on a second semiconductor substrate;
(6) a step of forming an insulating layer on the second substrate and forming a through-hole connecting to the grounding electrode in the insulating layer;
(7) a step of forming a through-hole grounding wiring electrically connecting to the grounding electrode in the through-hole;
(8) a step of smoothing the surface of the second semiconductor substrate;
(9) placing the first and second substrates so that the grounding layers and the through-hole grounding wirings on the first and second substrates will face each other;
(10) applying a compressive load from both sides of the substrates; and
(11) electrically connecting the grounding layer and the through-hole grounding wiring under the compressive load and mechanically connecting the grounding layer of the first substrate and the insulating layer of the second substrate.

SPECIFIED EXAMPLE 6 OF THE MANUFACTURING PROCESS

In the present embodiment, two semiconductor substrates, each carrying semiconductor elements, are connected to each other by the following process steps:
(1) a step of previously taking out a wiring electrode on a first semiconductor substrate;
(2) a step of sequentially depositing an insulating layer and a grounding layer on the first substrate and boring a through-hole connecting to the grounding electrode in the insulating layer;
(3) a step of forming a through-hole grounding wiring in the through-hole for electrical connection to the wiring electrode;
(4) a step of smoothing the surface of the first substrate;
(5) a step of depositing another insulating layer on the grounding layer;
(6) smoothing the surface of the first substrate;
(7) taking out a grounding electrode on a second semiconductor substrate;
(8) depositing an insulating layer on a second substrate and forming a through-hole connecting to a power source electrode in the insulating layer;
(9) a step of forming a through-hole grounding wiring for electrical connection to the grounding electrode in the through-hole;
(10) a step of smoothing the surface of the second substrate;
(11) depositing a power source electrode for electrically connecting to the through-hole power source wiring on the second semiconductor substrate;
(12) placing the first and second semiconductor substrates in alignment with each other so that the insulating layers and the power source layer of the first and second semiconductor substrates will face each other;
(13) applying a compressive load from both sides of the substrates; and
(14) mechanically connecting the insulating layer and the power source layer under the compressive load.

SPECIFIED EXAMPLE 7 OF THE MANUFACTURING PROCESS

In the present embodiment, two semiconductor substrates, each carrying semiconductor elements, are connected to each other by the following process steps:
(1) previously taking out a wiring electrode, a grounding electrode and a power source electrode on a first semiconductor substrate;
(2) sequentially depositing an insulating layer, a grounding layer and another insulating layer on the first substrate and forming a through-bole connecting to the power source electrode in the insulating layer, a grounding layer and in the other insulating layer;
(3) forming an in-through-hole power source wiring for electrically connecting to the grounding electrode in the through-hole;
(4) a step of forming an insulating layer between the peripheral wall of the through-hole in the grounding layer, power source layer and the grounding layer and the in-through-hole power source line;
(5) a step of smoothing the surface of the first substrate;
(6) a step of talking out a power source electrode on the second substrate;
(7) sequentially depositing an insulating layer and a power source layer on the second substrate and forming a through-hole connecting to the power source electrode in the insulating layer and in the power source layer;

(8) forming an in-through-hole power source wiring electrically connecting to the power source electrode in said through-hole;
(9) a step of smoothing the surface of the second semiconductor substrate;
(10) a step of placing the first and second semiconductor substrates in alignment with each other so that the in-through-hole power source wirings on the first and second semiconductor substrates will face each other and so that the insulating layer and the power source layer on the first and second semiconductor substrates will face each other;
(11) a step of applying a compressive load from both sides of the two substrates; and
(12) a step of electrically connecting in-through-hole power source wirings and mechanically connecting the insulating layer and the power source layer under the compressive load.

SPECIFIED EXAMPLE 8 OF THE MANUFACTURING PROCESS

In the specified example 1 of the manufacturing process, the following process steps are executed in parallel with the step of taking out the wiring:
(1) a step of previously taking out a grounding electrode on the first semiconductor substrate;
(2) a step of depositing an insulating layer on the first substrate and forming a through hole connecting to the grounding electrode in the insulating layer;
(3) a step of forming an insulating layer in the through-hole and forming an in-through-hole power source wiring in the through-hole;
(4) a step of forming a grounding layer electrically connecting to the in-through-hole power source wiring on the insulating layer;
(5) a step of smoothing the surface of one of the substrates;
(6) a step of previously taking out a grounding electrode on the first semiconductor substrate;
(7) a step of depositing an insulating layer on a second substrate and forming a through-hole connecting to the grounding electrode in the insulating layer;
(8) forming an in-through-hole power source wiring electrically connecting to a grounding electrode in the through-hole in the second substrate; and
(9) forming a grounding layer electrically connecting to the in-through-hole power source wiring on the insulating layer.

Although certain specified examples of the manufacturing process have been given above, it should be noted that these specified examples are merely illustrative and various modifications may be made within the scope of the invention.

An example of application of the present invention is now explained.

With the semiconductor device of the present invention, it is possible to realize highly integrated three-dimensional integrated circuits which may be utilized to achieve the following merits:
a) the wiring layer and the device layer are arranged as two separate layers to realize improved yield by separation of the wiring layer;
b) since the device layer is realized by multiple layers bonded together, analog/digital separation and resulting speedup is realized;
c) since two hetero device layers are deposited, analog/digital separation and resulting high operating speed may be realized;
d) since optical device elements are bonded to a silicon substrate, an optical device can be mounted on an electronic substrate;
e) by bonding the hetero semiconductor substrate, compound substrates and hence a hetero-epi substrate can be realized.

The configuration of the semiconductor device by solid state bonding may be globally classified depending on the connection configuration into a type exploiting a wafer die (chip) bonding and a type exploiting a wafer-to-wafer bonding.

The former may be exemplified by a flat panel computer as shown for example in FIG. 1.

In this flat panel computer, the variable LSIs, so far loaded on a printed circuit board, are directly bonded to the glass substrate, with the flat panel itself serving as a portable computer.

Figure 11:
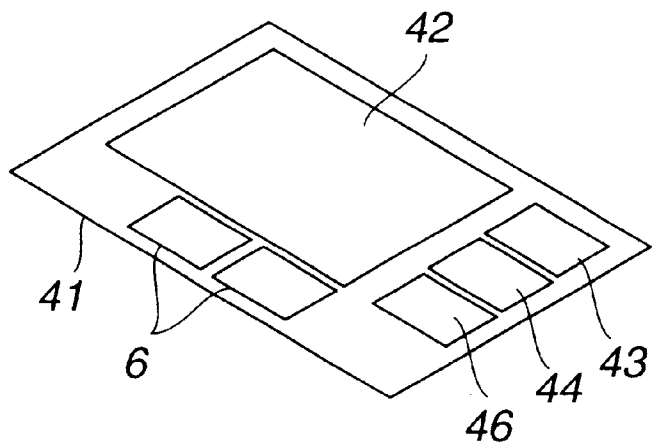
FIG. 11 is a schematic view showing another flat panel computer as an illustrative application.

In an embodiment shown in FIG. 11, a display unit 42, a CPU 43, a memory (RAM) 44, a memory (ROM) 45 and an input/output LSI 46, are directly bonded to a glass substrate 41.

Figure 12:
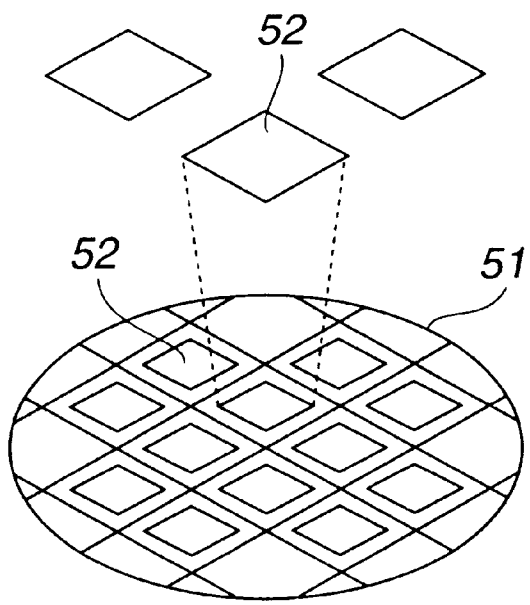
FIG. 12 is a schematic view showing an illustrative system LSI interconnecting process LSIs of different species by chip-on-chip.

FIG. 12 shows an example of bonding hetero-process LSIs by a chip-on-chip fashion. Specifically, hetero process LSI chips 52 are separately bonded on a wafer 51. The present embodiment shows a system LSI implementing technique by the hetero process LSIs. With the present example, no interposer substrate is required, so that it is possible to improve the performance by not employing buffers on the LSI.

The latter may be exemplified by a wafer-level three-dimensional layered device, a wiring layer bonding LSIs, obtained on bonding wiring layer portions interconnecting the functional blocks by the system LSIs (SOC), a structure of bonding package portions on the LSI on the wafer level, and a novel high-density module substrate capable of reducing the process rule gap between the substrate and the LSI.

In either cases, high-functional LSIs can be realized to make it possible to realize a three-dimensional integrated circuit exceeding the threshold of the planar fine-rule technique.

What is claimed is:

1. A method for manufacturing a semiconductor device in which a plurality of semiconductor substrates are bonded together, the method comprising
presenting a first semiconductor substrate having a first wiring layer and a second semiconductor substrate having a second wiring layer;
depositing a first insulating layer on the first semiconductor substrate and depositing a second layer on the second semiconductor substrate,
forming through the first insulating layer a first connection wiring connected to the first wiring layer and forming through the second layer a second connection wiring connected to the second wiring layer,
bonding an electrically conductive layer of an electrically conductive material on at least one of the first insulating layer and the second layer, the electrically conductive layer having an opening formed by patterning in register with at least one of the first and second connection wirings,
smoothing a junction surface of each semiconductor substrate, and
aligning the junction surfaces of the first and second semiconductor substrates to form an assembly and disposing the assembly between a compressive load to interconnect the first and second semiconductor substrates and to interconnect the first and second connection wirings, wherein the first and second semiconductor substrates are bonded together by a solid state bonding technique.

2. The method of claim 1, further comprising:

using the electrically conductive layer as either a ground or power layer.

3. A method for manufacturing a semiconductor device in which a plurality of semiconductor substrates are bonded together, the method comprising:

forming a wiring layer on each semiconductor substrate;

depositing an insulating layer on each semiconductor substrate;

for each semiconductor substrate, connecting a connection wiring through the insulating layer to the wiring layer; and forming on a junction surface of at least one of the semiconductor substrates an electrically conductive layer comprised of an electrically conductive material having an opening formed by patterning in register with the connection wiring, the electrically conductive layer operating as either a grounding layer or a power source layer;

bonding the semiconductor substrates together to interconnect the connection-wirings formed on each semiconductor substrate, wherein the semiconductor substrates are bonded together by the solid state bonding techniques.

4. The method of claim 3, wherein the electrically conductive material is an electrically conductive metal material so that a metal layer is bonded to an insulating layer.

5. The method of claim 3, wherein an electrically conductive layer is formed on a junction surface of each of paired semiconductor substrates that are to be bonded together.

6. The method of claim 3, wherein the electrically conductive layer is deposited between two insulating layers.

7. A method for manufacturing a semiconductor device in which a plurality of semiconductor substrates are bonded together, the method comprising presenting a plurality of semiconductor substrates, wherein a wiring layer is formed on each semiconductor substrate; an insulating layer is deposited on each semiconductor substrate, a connection wiring passes through the insulating layer for connection to the wiring layer on each semiconductor substrate;

forming on a junction surface of at least one of the semiconductor substrates an electrically conductive layer comprised of an electrically conductive material having an opening formed by patterning in register with the connection wiring; and bonding together the electrically conductive layer on the junction surface of at least one of the semiconductor substrate to an insulating layer of an opposite side semiconductor substrate in a manner to interconnect the connection wirings formed on each semiconductor substrate, wherein the semiconductor substrates are bonded together by a solid state bonding technique.

8. The method of claim 7, further comprising:

depositing an electrically conductive layer between two insulating layers.

9. The method of claim 7, wherein the inner diameter of the opening formed in the electrically conductive layer is larger than an inner diameter opening formed in the insulating layer.

* * * * *